United States Patent
Paul

(10) Patent No.: US 9,658,299 B2
(45) Date of Patent: May 23, 2017

(54) METHOD FOR DETERMINING A POSITION-DEPENDENT ATTENUATION MAP OF HIGH-FREQUENCY COILS OF A MAGNETIC RESONANCE PET DEVICE

(71) Applicant: Siemens Aktiengesellschaft, Munich (DE)

(72) Inventor: Dominik Paul, Bubenreuth (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 431 days.

(21) Appl. No.: 14/487,169

(22) Filed: Sep. 16, 2014

(65) Prior Publication Data

US 2015/0084626 A1 Mar. 26, 2015

(30) Foreign Application Priority Data

Sep. 25, 2013 (DE) .................. 10 2013 219 258

(51) Int. Cl.
*G01R 33/24* (2006.01)
*G01R 33/48* (2006.01)

(52) U.S. Cl.
CPC ......... *G01R 33/246* (2013.01); *G01R 33/481* (2013.01)

(58) Field of Classification Search
CPC .................. G01R 33/246; G01R 33/481
See application file for complete search history.

(56) References Cited

U.S. PATENT DOCUMENTS

| 5,318,025 A * | 6/1994 | Dumoulin | A61B 5/055 |
| | | | 128/899 |
| 8,988,075 B2 * | 3/2015 | Grodzki | G01R 33/4816 |
| | | | 324/307 |
| 2008/0135769 A1 * | 6/2008 | Rosen | G01T 1/1603 |
| | | | 250/363.09 |
| 2010/0074501 A1 * | 3/2010 | Ladebeck | G01R 33/481 |
| | | | 382/131 |

(Continued)

FOREIGN PATENT DOCUMENTS

DE 102010041587 A1 3/2012

OTHER PUBLICATIONS

German Office Action mailed Aug. 13, 2015.

*Primary Examiner* — G. M. Hyder
(74) *Attorney, Agent, or Firm* — Harness, Dickey & Pierce, P.L.C.

(57) ABSTRACT

A method is disclosed for determining a position-dependent attenuation map of at least one high frequency coil of a combined magnetic resonance PET device. A magnetic resonance PET device and a computer program product are also disclosed. The method includes determining at least one first signal frequency for at least one coil element during a magnetic resonance PET examination; determining at least one second signal frequency, wherein at least one gradient field is applied during determination thereof; reconstructing the position of the at least one coil element using the at least one first and second signal frequency; reconstructing the position of the at least one high frequency coil using the reconstructed position of the at least one coil element; and determining a position-dependent attenuation map of the at least one high frequency coil using the reconstructed position of the at least one high frequency coil.

15 Claims, 4 Drawing Sheets

(56) References Cited

U.S. PATENT DOCUMENTS

| | | | |
|---|---|---|---|
| 2010/0102813 A1* | 4/2010 | Schulz | A61B 6/037 |
| | | | 324/309 |
| 2011/0123083 A1* | 5/2011 | Ojha | G01N 24/08 |
| | | | 382/131 |
| 2012/0074941 A1 | 3/2012 | Grodzki | |
| 2014/0035577 A1* | 2/2014 | Blumhagen | G01R 33/543 |
| | | | 324/309 |
| 2015/0219737 A1* | 8/2015 | Fenchel | A61B 5/055 |
| | | | 600/411 |

* cited by examiner

METHOD FOR DETERMINING A POSITION-DEPENDENT ATTENUATION MAP OF HIGH-FREQUENCY COILS OF A MAGNETIC RESONANCE PET DEVICE

PRIORITY STATEMENT

The present application hereby claims priority under 35 U.S.C. §119 to German patent application number DE 102013 219258.4 filed Sep. 25, 2013, the entire contents of which are hereby incorporated herein by reference.

FIELD

At least one embodiment of the invention generally relates to a method for determining a position-dependent attenuation map of at least one high frequency coil of a combined magnetic resonance PET device, to a magnetic resonance PET device and/or to a computer program product.

BACKGROUND

Local high frequency coils with high frequency antennae are used to detect high frequency signals and/or magnetic resonance signals for magnetic resonance examinations in combination with a positron emission tomography examination (PET examination). In the case of the combination of magnetic resonance examinations with PET examinations, optimally accurate knowledge of a position and/or arrangement and/or geometry of the high frequency coils is required in order to exactly determine a signal attenuation which photons of a PET examination undergo as they pass through the high frequency coils. If high frequency coils are not taken into account in the attenuation correction, this can lead to absent PET events in the PET data and/or to image artifacts in the reconstructed image data. There is the difficulty, however, in the attenuation correction of high frequency coils that the local high frequency coils can be arranged on the patient at different positions and are often flexible and/or pliable. High frequency coils therefore often have an unknown geometry and/or unknown arrangement and/or unknown position.

SUMMARY

At least one embodiment of the invention is directed to enabling simple provision of a position-dependent attenuation map of at least one high frequency coil of a magnetic resonance PET device. Advantageous embodiments are described in the claims.

At least one embodiment of the invention is based on a method for determining a position-dependent attenuation map of at least one high frequency coil of a combined magnetic resonance positron emission tomography device (magnetic resonance PET device), wherein the high frequency coil includes at least one coil element, comprising:

determining at least one first signal frequency for the at least one coil element during a magnetic resonance PET examination, determining at least one second signal frequency for the at least one coil element during the magnetic resonance PET examination, wherein at least one gradient field is applied during determination of the at least one second signal frequency, reconstructing the position of the at least one coil element using the at least one first signal frequency and the at least one second signal frequency, reconstructing the position of the at least one high frequency coil using the reconstructed position of the at least one coil element and determining a position-dependent attenuation map of the at least one high frequency coil using the reconstructed position of the at least one high frequency coil.

An embodiment of the inventive magnetic resonance PET device has an arithmetic logic unit, wherein the magnetic resonance PET device is designed to carry out an embodiment of inventive method. The magnetic resonance PET device is therefore designed to carry out a method for determining a position-dependent attenuation map of at least one high frequency coil of a combined magnetic resonance PET device, wherein the high frequency coil includes at least one coil element. For this the magnetic resonance PET device includes the following units:

a determination unit which is designed to determine at least one first signal frequency for the at least one coil element during a magnetic resonance PET examination and to determine at least one second signal frequency for the at least one coil element during the magnetic resonance PET examination, wherein at least one gradient field is applied by way of a gradient control unit of the magnetic resonance PET device during determination of the at least one second signal frequency, and an evaluation unit which is designed to reconstruct the position of the at least one coil element using the at least one first signal frequency and the at least one second signal frequency, to reconstruct the position of the at least one high frequency coil using the reconstructed position of the at least one coil element and to determine a position-dependent attenuation map of the at least one high frequency coil using the reconstructed position of the at least one high frequency coil.

Embodiments of the inventive magnetic resonance PET device are constructed in the same way as the embodiments of the inventive method. A magnetic resonance PET device of this kind therefore allows automatic and efficient attenuation correction of the high frequency coils. The PET data generated by way of an inventive magnetic resonance PET device is therefore not subject to the quantification errors and artifacts triggered by the presence of the high frequency coils. The arithmetic logic unit can be installed separately from the magnetic resonance PET device. The arithmetic logic unit of the magnetic resonance PET device can carry out at least parts of at least one embodiment of an inventive method and/or send control information to the magnetic resonance PET device and/or receive control signals from the magnetic resonance PET device which carry out at least parts of an inventive method. For this the arithmetic logic unit can have control components which are necessary and/or advantageous for carrying out an inventive method. Computer programs and further software can be stored on a memory unit of the arithmetic logic unit, by which a processor of the arithmetic logic unit automatically controls and/or carries out a procedure of at least one embodiment of an inventive method.

An embodiment of the inventive computer program product can be loaded directly into a memory of programmable arithmetic logic unit of a magnetic resonance PET device and has program code segments to carry out an inventive method if the computer program product is executed in the arithmetic logic unit of the magnetic resonance PET device. AT least one embodiment of the inventive method can consequently be carried out quickly, so as to be repeated in an identical manner and robustly. The computer program product is configured in such a way that it can execute the inventive method steps by way of the arithmetic logic unit. The arithmetic logic unit must have the pre-requisites in each case, such as an appropriate main memory, an appropriate graphics card or an appropriate logic unit, so the respective method steps can be carried out efficiently. The computer program product is stored by way of example on a computer-readable medium or on a network or server, from where it can be loaded into the processor of a local arithmetic logic unit which can be directly connected to the magnetic resonance PET device or be constructed as part of the magnetic resonance PET device. Electronically readable control information may also be stored on an electronically readable data carrier. The control information can be configured in such a way that it carries out an inventive method when the data carrier is used in an arithmetic logic unit of a magnetic resonance PET device. Examples of electronically readable data carriers are a DVD, magnetic tape or a USB stick, on which electronically readable control information, in particular a computer program product, is stored. All inventive embodiments of the method described above can be carried out if this control information is read by the data carrier and stored in the arithmetic logic unit of the magnetic resonance PET device.

BRIEF DESCRIPTION OF THE DRAWINGS

The invention will be described and illustrated in more detail below with reference to the example embodiments shown in the figures, in which.

DETAILED DESCRIPTION OF THE EXAMPLE EMBODIMENTS

Figure 1:
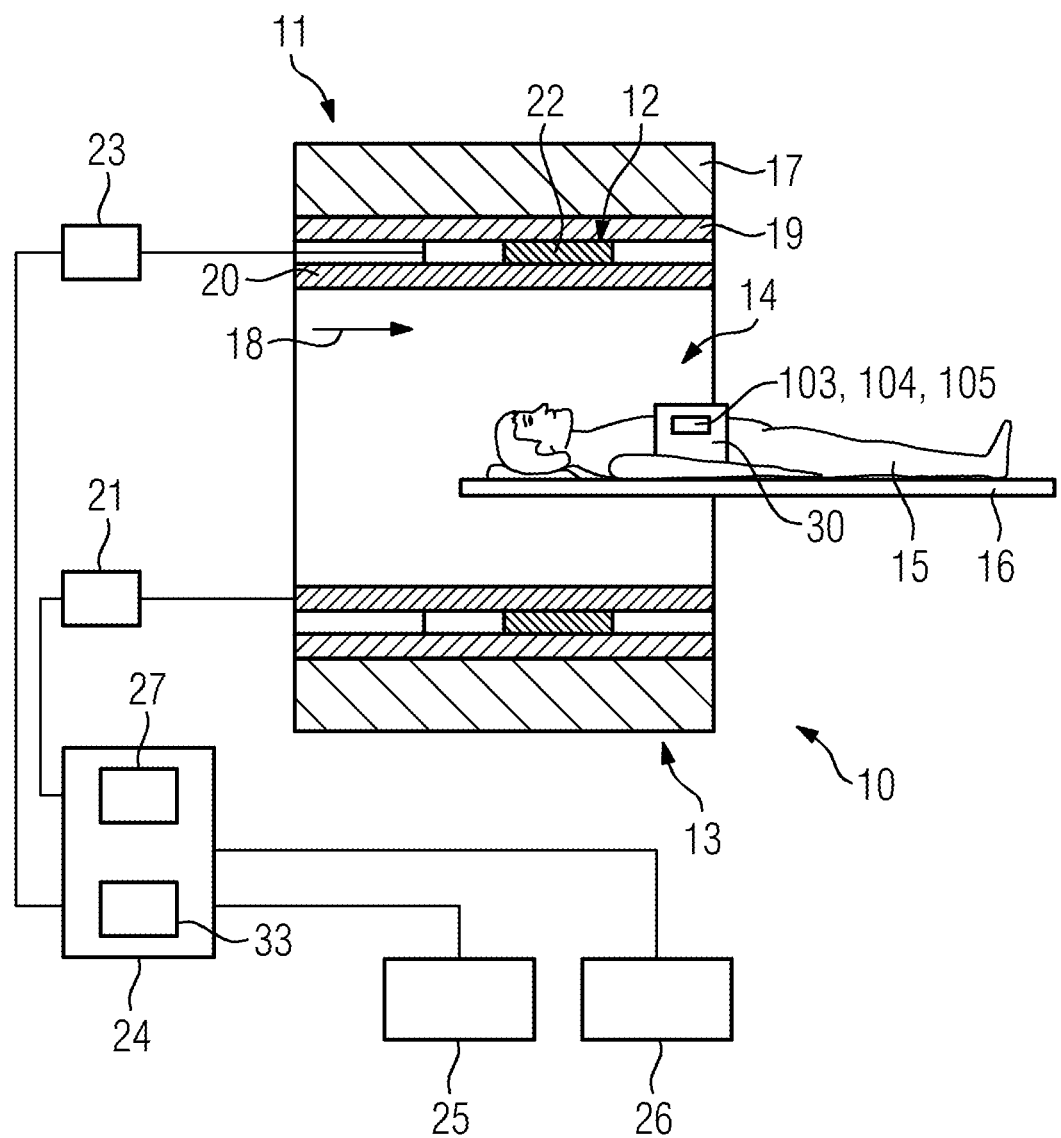
FIG. 1 shows in a schematic diagram a combined magnetic resonance PET device having a high frequency coil for carrying out an embodiment of an inventive method.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

At least one embodiment of the invention is based on a method for determining a position-dependent attenuation map of at least one high frequency coil of a combined magnetic resonance positron emission tomography device (magnetic resonance PET device), wherein the high frequency coil includes at least one coil element, comprising:

determining at least one first signal frequency for the at least one coil element during a magnetic resonance PET examination, determining at least one second signal frequency for the at least one coil element during the magnetic resonance PET examination, wherein at least one gradient field is applied during determination of the at least one second signal frequency, reconstructing the position of the at least one coil element using the at least one first signal frequency and the at least one second signal frequency, reconstructing the position of the at least one high frequency coil using the reconstructed position of the at least one coil element and determining a position-dependent attenuation map of the at least one high frequency coil using the reconstructed position of the at least one high frequency coil.

Magnetic resonance signals for determining the signal frequencies are advantageously recorded during the magnetic resonance PET examination. This means that the signal frequencies are recorded once a patient has been positioned inside the magnetic resonance PET device for recording diagnostic image data for diagnostic purposes and the high frequency coils have been arranged for recording the diagnostic image data. The patient preferably maintains his position between recording of the signal frequencies and the diagnostic image data such that the position of the at least one high frequency coil is maintained between recording of the signal frequencies and the diagnostic image data. The signal frequencies can also be recorded in addition to the recording of diagnostic image data.

Alternatively signal frequencies for reconstructing the position of the at least one high frequency coil can also be determined from magnetic resonance signals recorded for diagnostic purposes. The signal frequencies can be recorded during a localization recording (overview recording), which is conventionally carried out at the start of the magnetic resonance PET examination of a patient. This has the advantage that it is not necessary to expend additional time on the acquisition of the signal frequencies during the magnetic resonance PET examination. The signal frequencies and/or the magnetic resonance signals for determining the signal frequencies are preferably recorded by way of the at least one high frequency coil.

A high frequency coil typically has between two and 64, in particular between four and twelve, coil elements. Each coil element typically constitutes a receiving unit for receiving magnetic resonance signals, in particular a receiving coil. The coil elements can be combined to form groups of a plurality of coil elements in each case. The coil elements of the high frequency coil can be arranged in the form of a grid, in particular a rectangular grid. Each coil element of the high frequency coil can contribute with its individual signal receiving characteristics to the signal receiving characteristics of the entire high frequency coil.

During a typical recording of signal frequencies, the signal frequencies of the individual coil elements are combined to form an overall signal frequency. However, a mode can be activated on a magnetic resonance PET device, so the signal frequencies recorded by way of the individual coil elements are stored. The individual signal frequencies can also be reconstructed from an overall signal frequency. The individual signal frequencies can be used to draw a conclusion about the position of the coil element belonging to the respective signal frequency of the coil element. A conclusion about the position of the high frequency coil can then be drawn from the positions of the coil elements. The more coil elements a high frequency coil has, the more accurately the position of the high frequency coil can be reconstructed.

Determination of the at least one first signal frequency and/or determination of the at least one second signal frequency can include determination of at least one signal frequency of protons bound in water molecules. Alternatively the signal frequency of protons bound in fat molecules can also be determined, or, to improve the accuracy, both the signal frequency of protons bound in water molecules and the signal frequency of protons bound in fat molecules can be determined. Determination of the signal frequency can include determination of the precession frequency of the protons. One individual signal frequency or a plurality of individual signal frequencies can be determined for each coil element of the high frequency coil.

Determination of the second signal frequency can include applying one gradient field respectively for each spatial direction. The gradient field can have a strength of 1 to 40 mT/m, in particular a strength between 3 and 20 mT/m, advantageously a strength between 5-10 mT/m. The gradient fields can be applied in the main magnetic field direction, horizontally perpendicular to the main magnetic field direction and vertically perpendicular to the main magnetic field direction. The second signal frequency is preferably determined three times, wherein with each determination one gradient field respectively is applied in one spatial direction respectively. The three spatial directions are preferably orthogonal to each other for this purpose.

The gradient field produces a location-dependent magnetic field strength and therefore a displacement of the determined second signal frequencies with respect to the first signal frequencies. The displacement of a coil element, by way of example with respect to the zero point or a reference point of the gradient system, can be determined on the basis of the known strength of the gradient field and the measured displacement of the second signal frequencies with respect to the first signal frequencies. The expansion of the signal frequency spectrum, caused by way of the gradient field, with respect to the displacement of the coil element can be largely ignored due to the physically limited size of the coil elements.

The position of the at least one high frequency coil can be reconstructed relative to a reference point of the magnetic resonance PET device. The reference point of the magnetic resonance PET device may be the isocenter of a magnetic resonance device or a PET device of the magnetic resonance PET device. The reference point can be the origin of the coordinate system of the magnetic resonance PET device which is located by way of example in the center of the volume to be examined. The reference point can also be any other location in the magnetic resonance PET device. The position of the high frequency coil can also be reconstructed relative to a reference point of an object to be examined that is positioned in the magnetic resonance PET device. The object to be examined may be a patient, a user or a phantom.

Reconstruction of the position of the high frequency coil relative to a reference point of an object to be examined can implicitly include determination of the position relative to a reference point of the magnetic resonance PET device since the position of the object to be examined in the magnetic resonance PET device is typically known for example from the magnetic resonance image data. Reconstruction of the position of the high frequency coil can include reconstruction of the position of the high frequency coil in the magnetic resonance PET device. Reconstruction of the position of the high frequency coil can also include reconstruction of a shape and/or orientation and/or geometry of the high frequency coil and/or individual coil elements of the high frequency coil. The position of the high frequency coil can be reconstructed independently of a body region to be examined and/or the size of a patient.

An attenuation map of a high frequency coil typically includes a spatially resolved item of information about the attenuation values of the high frequency coil with respect to the attenuation of photons, in particular of photons with a power of 511 keV. The attenuation values of the high frequency coil depend inter alia on the material and material thickness of the high frequency coil. The attenuation values are typically stored in the form of linear attenuation coefficients with the unit 1/cm. An attenuation map can be used for the attenuation correction of PET data. With respect to the attenuation correction, the part of the high frequency coil which is located between the place of origin of the gamma quanta and the PET detector is relevant.

Determination of the position-dependent attenuation map of at least one high frequency coil can include creation and/or loading of a general attenuation map. A general attenuation map of a high frequency coil can be an attenuation map which is not adjusted to the position and geometry of the high frequency coil. The general attenuation map can be loaded from a database. The general attenuation maps of different high frequency coils can be stored in the database. The database can be integrated in the magnetic resonance PET device and/or be stored on a server which the magnetic resonance PET device can access. The general attenuation map can also be loaded from a data carrier. The general attenuation map of the high frequency coil can be created by way of a computed tomography system, a radiation therapy device or a PET transmission measurement.

A position-dependent attenuation map can be determined by way of the reconstructed actual position and/or geometry of the high frequency coil in the volume to be examined during the magnetic resonance PET examination. For an attenuation correction of the high frequency coil the position of the high frequency coil is preferably determined with an accuracy of a maximum of 10 mm, advantageously a maximum of 5 mm, ideally a maximum of 3 mm. Determination of the position-dependent attenuation map can include an adjustment and/or registering and/or transformation of the general attenuation map of the high frequency coil using the reconstructed position of the high frequency coil. The transformation of the general attenuation map can be rigid and therefore include only one displacement and/or rotation of the general attenuation map in at least one spatial direction. The transformation can, however, also be non-rigid and change the shape of the high frequency coil in the general attenuation map.

The individual position of the high frequency coils or a plurality of high frequency coils can be determined by way of an inventive method. The position is typically automatically determined or determined with only minimal user intervention. Markers or markings are not necessary for determining the position of the high frequency coils since the positions of the high frequency coils can be determined directly from the recorded signal frequencies. Automated attenuation correction of the high frequency coils is therefore possible in combined magnetic resonance PET imaging. The PET data generated by way of an inventive method is typically not subject, or subject to only a reduced degree, to the quantification errors and artifacts triggered by the presence of the high frequency coils.

One embodiment provides that the at least one gradient field applied during determination of the at least one second signal frequency has a gradient field strength whose value differs from the gradient field strength of a gradient field which is applied during determination of the at least one first signal frequency. A gradient field typically describes the spatial distribution of the gradient field strength of the gradient field. If the gradient field strength has a value of zero over the whole measuring range, then a gradient field with a field strength of zero exists. The at least one gradient field, which is applied during determination of the second signal frequency, advantageously has a gradient field strength of more than zero, whereas the gradient field, which is applied during determination of the first signal frequency, has a gradient field strength of zero. It can hereby be achieved that the second signal frequencies differ from the first signal frequencies due to the gradient field applied during determination of the second signal frequencies. A position of the coil elements can be ascertained particularly easily therefore using the different first and second signal frequencies.

One embodiment provides that the determination of the at least one second signal frequency includes determining a signal frequency for a spatial direction, wherein determination of the signal frequency for the spatial direction includes applying a gradient field in the spatial direction. This can be repeated for any of the three spatial directions. A conclusion can therefore be drawn particularly easily about the position of a coil element in the spatial direction from the second signal frequency determined for one spatial direction, the determined first signal frequency and the known strength of the gradient field.

One embodiment provides that reconstruction of the position of the at least one coil element is carried out by way of at least one frequency difference between the at least one first signal frequency and the at least one second signal frequency. The frequency difference (frequency shift) in one spatial direction is typically the product of the increase in the strength of the gradient field in the spatial direction, the displacement of the position of a coil element with respect to the zero point of the gradient system, and the gyromagnetic constant which is characteristic for the chemical element to be examined and is in particular 42.58 MHz/T for protons. The frequency difference between the first and second signal frequencies is conditioned by the fact that a coil element displaced with respect to the zero point of the gradient system experiences a different magnetic field strength during recording of the second signal frequency than during recording of the first signal frequency due to the gradient field. A displaced coil element also experiences a different magnetic field strength to a non-displaced coil element during recording of the second signal frequency.

One embodiment provides that reconstruction of the position of the at least one high frequency coil includes using an item of information about the construction and/or geometry of the at least one high frequency coil. The known construction and/or known geometry of the high frequency coil can provide limitations to the possible position of the coil elements of the high frequency coil. Degrees of freedom of movement of the high frequency coil can also be limited during determination of the position. Information about the known coil geometry can be stored in a database. The use of items of information about the construction and/or geometry of the at least one high frequency coil can improve the accuracy of the reconstructed position of the high frequency coil.

One embodiment provides that the at least one high frequency coil comprises a plurality of coil elements which are arranged in the form of a grid, wherein reconstruction of the position of the at least one high frequency coil includes adjustment of a landmark grid to the reconstructed positions of the plurality of coil elements. The coil elements can be arranged in the form of a rectangular grid, wherein the product of the number of coil elements in the longitudinal direction and the number of coil elements in the transverse direction produces the number of all coil elements. The grid preferably corresponds to an arrangement of the individual coil elements determined by way of the signal frequencies and therefore actual. Grid points of the grid can be positioned at the centers of the coil elements. The landmark grid can be a grid model of the high frequency coil which is dependent on the kind and/or type of high frequency coil used and is typically stored in a database. Adjustment of the landmark grid to the grid of the reconstructed positions of the plurality of coil elements includes the use of the reconstructed positions of the individual coil elements using the determined signal frequencies.

The position of the high frequency coil can be reconstructed by way of the determined reconstructed positions of the coil elements and the adjustment and/or adaptation of the landmark grid. The adjustment of the landmark grid can be made by way of segmenting, by way of a landmark grid capable of adjustment and/or by way of a rigid landmark grid. With fixed coils, by way of example knee coils, which can be variably spatially positioned, however, a fixed landmark grid is typically assumed and only the position of the landmark grid in the space is adapted to the grid defined by the positions of the coil elements by way of a translation and/or a rotation of the landmark grid. With flexible coils, by way of example flexible surface coils, the landmark grid can be transformed non-rigidly. Flexible coils typically adapt in terms of their shape to the surface of the object to be examined. Adaptation of the landmark grid advantageously provides registration parameters, using which a general attenuation map of the high frequency coil can be transformed to a position-dependent attenuation map. Registration of the general attenuation map to produce the position-dependent attenuation map can include a process in which the general attenuation map is changed in such a way that it is adapted to the position and/or geometry of the high frequency coil. The adaptation can be carried out by way of the registration parameters which were ascertained during adaptation of the landmark grid to the reconstructed position of the plurality of coil elements.

One embodiment provides that adaptation of the landmark grid includes using properties of the at least one high frequency coil as boundary conditions. Properties of the at least one high frequency coil can be the size of the coil elements, the spacing between two coil elements respectively and/or the flexibility of the high frequency coil, in particular possible flexibility axes of high frequency coils. By way of example, the fixed distance between two coil elements leads to a limitation of the adaptation of the grid points of the landmark grid. Greater differences in the position of the coil elements can therefore be prevented in the adaptation of the grid points. The known flexibility axes of the high frequency coil can lead to the grid points not being able to be randomly displaced toward each other and/or only certain grid points being able to be displaced toward each other in certain spatial directions. The flexibility axes of the high frequency coil are preferably located between two coil elements. The accuracy of adaptation of the landmark grid can be improved by using the properties of the at least one high frequency coil as boundary conditions for adaptation of the landmark grid.

One embodiment provides that a combined attenuation map of the magnetic resonance PET device is ascertained by way of the position-dependent attenuation map of the at least one high frequency coil and a global attenuation map of the magnetic resonance PET device. The global attenuation map or the combined attenuation map can be used for attenuation correction of PET image data. The attenuation correction of the PET image data can occur before and/or during reconstruction of the PET image data. The attenuation data of the object to be examined and/or additional hardware components, by way of example the examination table or stationary magnetic resonance coils, are typically stored in the global attenuation map. The position-dependent attenuation map of the high frequency coil can then be subsequently integrated in the global attenuation map at the correct location and/or with the correct geometry of the high frequency coil.

Integration can occur by way of addition of the attenuation value of the high frequency coil to the attenuation values of the global attenuation map. The attenuation correction of the PET image data records can then occur with the combined attenuation map which contains the attenuation values of the global attenuation map and high frequency coil. The attenuation correction of the PET image data records by way of the combined attenuation map can then occur in such a way that the events recorded by a detector are corrected by taking account of the attenuation values of the combined attenuation map located between the detector and the origin of the gamma quanta.

An embodiment of the inventive magnetic resonance PET device has an arithmetic logic unit, wherein the magnetic resonance PET device is designed to carry out an embodiment of inventive method. The magnetic resonance PET device is therefore designed to carry out a method for determining a position-dependent attenuation map of at least one high frequency coil of a combined magnetic resonance PET device, wherein the high frequency coil includes at least one coil element. For this the magnetic resonance PET device includes the following units:

a determination unit which is designed to determine at least one first signal frequency for the at least one coil element during a magnetic resonance PET examination and to determine at least one second signal frequency for the at least one coil element during the magnetic resonance PET examination, wherein at least one gradient field is applied by way of a gradient control unit of the magnetic resonance PET device during determination of the at least one second signal frequency, and an evaluation unit which is designed to reconstruct the position of the at least one coil element using the at least one first signal frequency and the at least one second signal frequency, to reconstruct the position of the at least one high frequency coil using the reconstructed position of the at least one coil element and to determine a position-dependent attenuation map of the at least one high frequency coil using the reconstructed position of the at least one high frequency coil.

Embodiments of the inventive magnetic resonance PET device are constructed in the same way as the embodiments of the inventive method. A magnetic resonance PET device of this kind therefore allows automatic and efficient attenuation correction of the high frequency coils. The PET data generated by way of an inventive magnetic resonance PET device is therefore not subject to the quantification errors and artifacts triggered by the presence of the high frequency coils. The arithmetic logic unit can be installed separately from the magnetic resonance PET device. The arithmetic logic unit of the magnetic resonance PET device can carry out at least parts of at least one embodiment of an inventive method and/or send control information to the magnetic resonance PET device and/or receive control signals from the magnetic resonance PET device which carry out at least parts of an inventive method. For this the arithmetic logic unit can have control components which are necessary and/or advantageous for carrying out an inventive method. Computer programs and further software can be stored on a memory unit of the arithmetic logic unit, by which a processor of the arithmetic logic unit automatically controls and/or carries out a procedure of at least one embodiment of an inventive method.

An embodiment of the inventive computer program product can be loaded directly into a memory of programmable arithmetic logic unit of a magnetic resonance PET device and has program code segments to carry out an inventive method if the computer program product is executed in the arithmetic logic unit of the magnetic resonance PET device. AT least one embodiment of the inventive method can consequently be carried out quickly, so as to be repeated in an identical manner and robustly. The computer program product is configured in such a way that it can execute the inventive method steps by way of the arithmetic logic unit. The arithmetic logic unit must have the pre-requisites in each case, such as an appropriate main memory, an appropriate graphics card or an appropriate logic unit, so the respective method steps can be carried out efficiently. The computer program product is stored by way of example on a computer-readable medium or on a network or server, from where it can be loaded into the processor of a local arithmetic logic unit which can be directly connected to the magnetic resonance PET device or be constructed as part of the magnetic resonance PET device. Electronically readable control information may also be stored on an electronically readable data carrier. The control information can be configured in such a way that it carries out an inventive method when the data carrier is used in an arithmetic logic unit of a magnetic resonance PET device. Examples of electronically readable data carriers are a DVD, magnetic tape or a USE stick, on which electronically readable control information, in particular a computer program product, is stored. All inventive embodiments of the method described above can be carried out if this control information is read by the data carrier and stored in the arithmetic logic unit of the magnetic resonance PET device.

FIG. 1 shows in a schematic diagram a combined magnetic resonance PET device 10 having a high frequency coil 30 for carrying out an embodiment of the inventive method. The magnetic resonance PET device 10 comprises a magnetic resonance device 11 and a positron emission tomography device 12 (PET device 12).

The magnetic resonance device 11 comprises a magnetic unit 13 and a patient-receiving region 14, surrounded by the magnetic unit 13, for receiving an object to be examined 15, in particular a patient 15, wherein the patient-receiving region 14 is cylindrically surrounded in a circumferential direction by the magnetic unit 13. The patient 15 can be moved by way of a patient positioning device 16 of the magnetic resonance device 11 into the patient-receiving region 14. The patient positioning device 16 is movably arranged inside the patient-receiving region 16 for this purpose.

The magnetic unit 13 comprises a main magnet 17 which, during operation of the magnetic resonance device 11, is designed to produce a strong, and in particular constant, main magnetic field 18. The magnetic unit 13 also has a gradient coil unit 19 for producing a magnetic field gradient which is used for spatial encoding during imaging. The gradient coil unit 19 is also designed to produce gradient fields. The magnetic unit 13 also comprises a body coil 20 which is provided to excite a polarization which is adjusted in the main magnetic field 18 produced by the main magnet 17. The body coil 20 is also provided for receiving magnetic resonance signals. The body coil 20 is designed to receive first and second signal frequencies. The body coil 20 is permanently integrated inside the magnetic unit.

For control of the main magnet of the gradient coil unit 19 and for control of the body coil 20 the magnetic resonance PET device 10, in particular the magnetic resonance device 11, has a magnetic resonance control unit 21. The magnetic resonance control unit 21 centrally controls the magnetic resonance device 11, such as the execution of a predetermined imaging gradient echo sequence. For this purpose the magnetic resonance control unit 21 has a gradient control unit (not shown) and a high frequency antenna control unit (not shown). The magnetic resonance control unit 21 also has an evaluation unit for evaluation of magnetic resonance image data or magnetic resonance signals.

The magnetic resonance device 11 also has a high frequency coil 30 which is designed to receive magnetic resonance signals. The high frequency coil 30 is applied by a medical operator to a body region of the patient 15 to be examined for a magnetic resonance examination. In the present example embodiment the high frequency coil 30 is formed by a body antenna unit. In principle an embodiment of the high frequency coil 30 as a knee antenna unit and/or back antenna unit, etc. is also conceivable at any time. It is also conceivable for more than one high frequency coil 30 to be positioned on the patient 15. Each high frequency coil 30 has a plurality of coil elements 103,104,105 in this case.

The illustrated magnetic resonance device 11 can of course include further components which magnetic resonance devices 11 conventionally comprise. A general mode of operation of a magnetic resonance device 11 is known to a person skilled in the art, moreover, so a detailed description of the general components will be omitted.

The PET device 12 comprises a plurality of positron emission tomography detector modules 22 (PET detector modules 22) that are arranged to form an annular shape and surround the patient-receiving region 14 in the circumferential direction. The PET detector modules 22 each have a plurality of positron emission tomography detector elements (PET detector elements) (not shown) which are arranged to form a PET detector array which comprises a scintillation detector array with scintillation crystals, by way of example LSO crystals. The PET detector modules 22 also each comprise a photodiode array, by way of example an avalanche photodiode array or APD photodiode array, that are arranged downstream of the scintillation detector array and inside the PET detector modules 22.

Photon pairs, which result from the annihilation of a positron with an electron, are detected by way of the PET detector modules 22. Trajectories of the two photons enclose an angle of 180°. The two photons each have a power of 511 keV, moreover. The positron is emitted by a radiopharmaceutical, wherein the radiopharmaceutical is administered to the patient 15 by way of an injection. The photons produced during annihilation can be attenuated as they pass through substance, wherein the attenuation probability depends on the path length through the substance and the corresponding attenuation coefficient of the substance. During an evaluation of the PET signals a correction of these signals is therefore necessary with respect to the attenuation by components that are located in the beam path.

The PET detector modules 22 also each have an electronic detector which comprises an electric amplifier circuit and further electronic components (not shown). The magnetic resonance PET device 10, in particular the PET device 12, has a PET control unit 23 for controlling the electronic detector and the PET detector modules 22. The PET control unit 23 centrally controls the PET device 12. Furthermore, the PET control unit 23 comprises an evaluation unit for evaluation of PET data.

The illustrated PET device 12 can of course comprise further components which PET devices 12 conventionally have. A general mode of operation of a PET device 12 is known to a person skilled in the art, moreover, so a detailed description of the general components will be omitted.

The magnetic resonance PET device 10 also has a central arithmetic logic unit 24 which, by way of example, coordinates detection and/or evaluation of magnetic resonance image data and PET image data. The arithmetic logic unit 24 can be a central system control unit. Control information, such as imaging parameters, and reconstructed image data can be displayed for a user on a display unit 25, by way of example on at least one monitor, of the magnetic resonance PET device 10. The magnetic resonance PET device 10 also has an input unit 26, by which items of information and/or parameters can be input by a user during a measuring process. The arithmetic logic unit 24 can comprise the magnetic resonance control unit 21 and/or the PET control unit 23.

The central arithmetic logic unit 24 of the magnetic resonance PET device 10 also has an evaluation unit 27 which carries out reconstruction of a position of the high frequency coil 30 using the determined and/or detected signal frequencies. Using an item of information about a structure and/or material properties of the high frequency coil 30 the evaluation unit 27 calculates a general attenuation map with attenuation values, and this describes the attenuation which photons experience as the high frequency coil 30 penetrates during PET data capture. Using the reconstructed position of the high frequency coil 30 the general attenuation map of the high frequency coil 30 can be integrated by the evaluation unit 27 in a global attenuation map of the magnetic resonance PET device 10 which is used for an image reconstruction of the PET data of the PET measurement. The evaluation unit 27 is also designed for reconstructing the positions of the coil elements 103,104, 105 and the position of the high frequency coil. The arithmetic logic unit 24 also has a determination unit 33 which is designed for determining the first and second signal frequencies.

Figure 2:
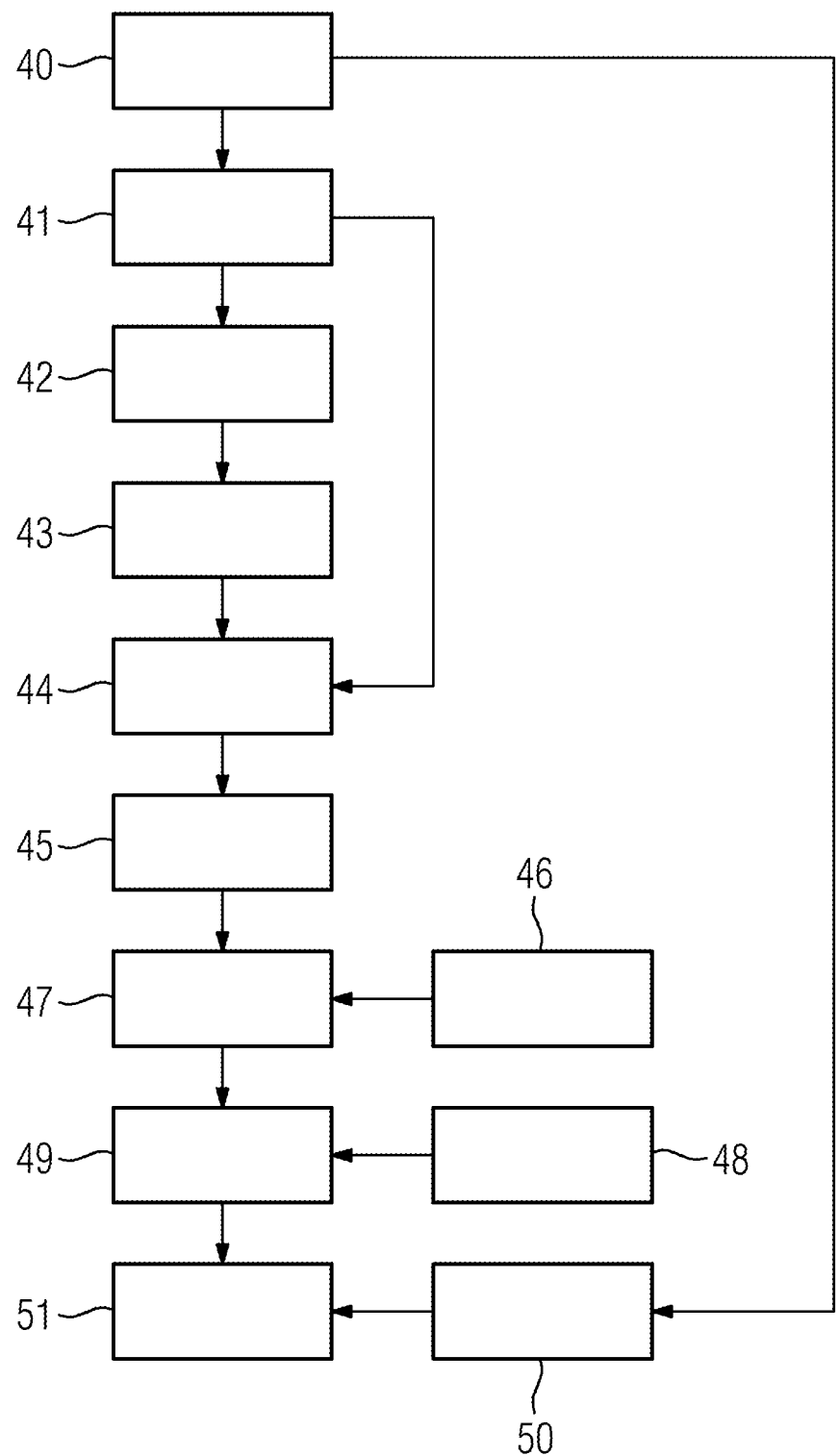
FIG. 2 shows a flow diagram of an embodiment of an inventive method.

FIG. 2 shows a flow diagram of an embodiment of an inventive method. Determination of the position of the coil elements 103,104,105 of a high frequency coil 30 in a spatial direction perpendicular to the main magnetic field 18 of a magnetic resonance PET device 10 is described. The method steps can be repeated in the same way for the determination of the position of the coil elements 103,104,105 in the other spatial directions. In a first method step 40 an object to be examined 15, in particular a patient 15, is positioned on the patient positioning device 16 of the magnetic resonance PET device 10 to record diagnostic image data. A high frequency coil 30 for recording the magnetic resonance signals, which are used to create diagnostic image data, is then positioned on the patient 15.

In a further method step 41 a first signal frequency of protons bound in water molecules is determined by way of the determination unit 33 of the arithmetic logic unit 24 and of the magnetic resonance device 11 for each coil element 103,104,105 of the high frequency coil 30. The first signal frequency is determined while a gradient field with a gradient field strength of zero is applied in the spatial direction. In a further method step 42 a magnetic gradient field, by way of example with a strength of 5 mT/m, is applied in the spatial direction by way of the gradient coil unit 19. In a further method step 43, while the magnetic gradient field is applied, a second signal frequency of protons bound in water molecules is determined for each coil element 103,104,105 by way of the determination unit 33 of the arithmetic logic unit 24 and of the magnetic resonance device 11.

In a further method step 44 the difference is formed for each coil element 103,104,105 from the second signal frequency pertaining to the coil element 103,104,105 and the first signal frequency by way of the determination unit 24 of the arithmetic logic unit 24. In a further method step 45 a conclusion is drawn from the formed frequency difference for each coil element 103,104,105 and by way of the evaluation unit 27 of the arithmetic logic unit 24 (see FIG. 3-6) about the positions of the coil element 103,104,105. This occurs by way of division of the frequency difference by the increase in the gradient field strength of the magnetic gradient field in the spatial direction and the gyromagnetic constant.

In a further method step 46 a landmark grid is created for the coil elements 103,104,105, arranged in a grid-like manner, of the high frequency coil 30 and stored in a database. The landmark grid is a model grid for the arrangement of the coil elements 103,104,105 of the high frequency coil 30. The landmark grid is adapted in a further method step 47 to the grid, which is formed by the reconstructed positions of the coil elements 103, 104,105, by way of the evaluation unit 27 of the arithmetic logic unit 24. Information relating to a construction and/or geometry of the high frequency coil 30 is used in this connection. The landmark grid is in particular adapted using known properties of the high frequency coil 30 as boundary conditions.

In a further method step 48 a general attenuation map of the high frequency coil 30 is created preferably before the magnetic resonance PET examination begins, by way of example by way of a computed tomography system (not shown). The general attenuation map of the high frequency coil 30 is then transformed in a further method step 49 by way of the evaluation unit 27 of the arithmetic logic unit 24 by way of the reconstructed position of the high frequency coil 30 into a position-dependent attenuation map of the high frequency coil. The position-dependent attenuation map is then integrated by way of the evaluation unit 27 of the arithmetic logic unit 24 into a global attenuation map of the magnetic resonance PET device 10, wherein a combined attenuation map is produced.

In a further method step 50 magnetic resonance measurement data is recorded from the patient 15 by way of the magnetic resonance device 11 and PET measurement data by way of the PET device 12. The patient 15 and the high frequency coil 30 have retained their position with respect to the determination of the signal frequencies in the further method steps 41-43 for this. The PET measurement data is finally reconstructed in a further method step 51 by way of the evaluation unit 27 and the PET control unit 23 by way of the combined attenuation map, which contains the attenuation value of the high frequency coil 30.

The method steps of an embodiment of the inventive method described in FIG. 2 are executed by the arithmetic logic unit 24 together with the magnetic resonance PET device 10. For this purpose the arithmetic logic unit 24 comprises software and/or computer programs required for this, and these are stored in a memory unit of the arithmetic logic unit 24. The software and/or computer programs comprise program segments which are configured to execute the inventive method if the computer program and/or the software is executed in the arithmetic logic unit 24 by way of a processor unit of the magnetic resonance PET device 10. It is crucial that the reconstruction of the position of the high frequency coil 30 is not limited to a high frequency coil 30. The positions of any number of high frequency coils 30, which are used in the magnetic resonance PET examination, can be reconstructed.

Figure 3:
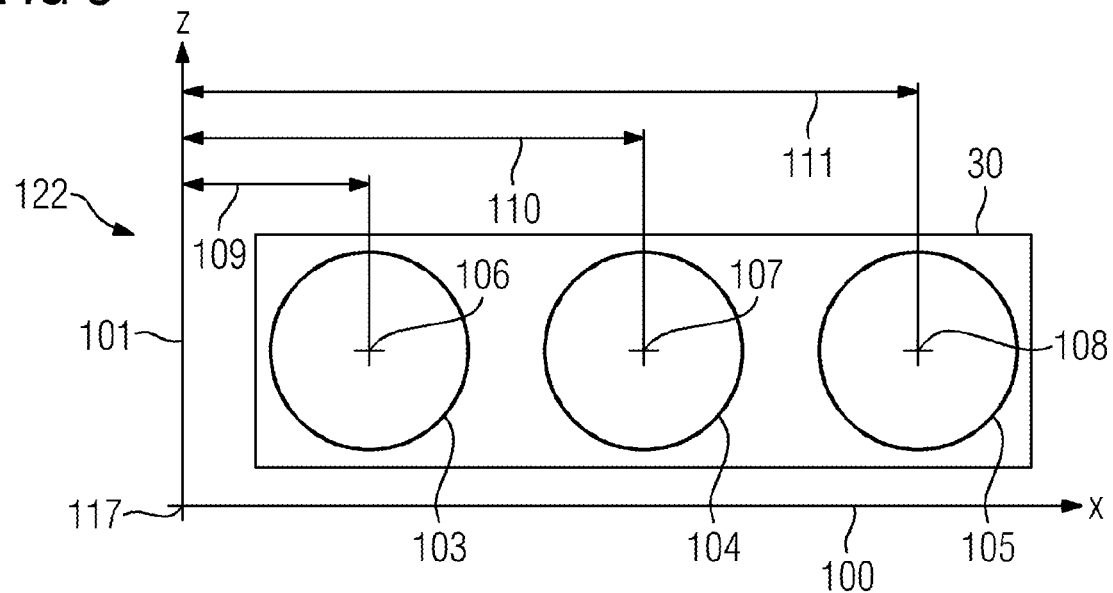
FIG. 3 shows an example inventive determination of the positions of three coil elements of a high frequency coil in the x direction.
Figure 4:
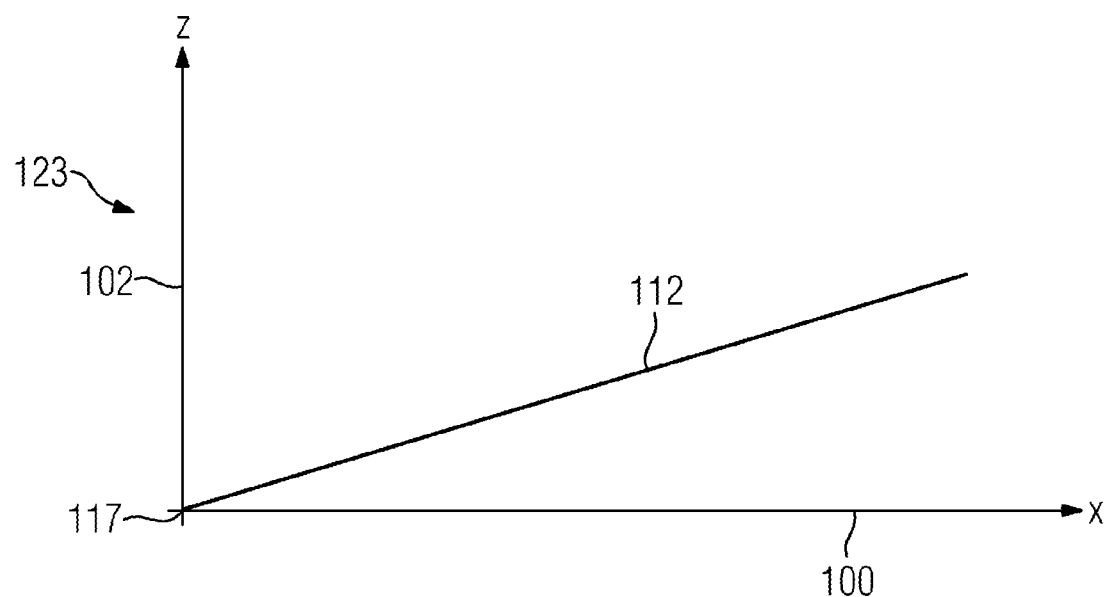
FIG. 4 shows the strength of the gradient field belonging to FIG. 3 in the x direction.

FIG. 3 together with FIG. 4 shows an example determination of the positions of the three coil elements 103,104, 105 of a high frequency coil 30 in the x direction according to the additional method step 45. The x direction is in this connection intended to mean the direction which is horizontally perpendicular to the direction of the main magnetic field 18, the z-direction. The y direction is intended to mean the direction which is vertically perpendicular to the z direction and perpendicular to the x direction. In FIG. 3-6 the same axes, which describe identical directions, are each provided with the same reference numerals.

The x direction is plotted on the first axis 100 of the graph 122 of FIG. 3 while the y direction is plotted on the second axis 101. The intersection 117 of the first axis 100 with the second axis 101 is the zero point (origin, offset) of the gradient coil unit 19 of the magnetic resonance device 11 in the xz plane. A plan view of a high frequency coil 30, which comprises three coil elements 103,104,105, namely a first coil element 103 with a first center 106 in the xy direction, a second coil element 104 with a second center 107 in the xy direction, and a third coil element 105 with a third center 108 in the xy direction, are shown. The first center 106 has a first spacing 109 in the x direction from the zero point 117. Similarly, the second center 107 has a second spacing 110 from the zero point 117, and the third center 108 has a third spacing 111 from the zero point 117. The x direction is again plotted on the first axis 100 of the graph 123 of FIG. 4 while the strength of the gradient field in the x direction is plotted on the second axis 102, wherein the gradient field according to the further method step 42 is applied during recording of the second signal frequencies. The strength of the gradient field grows linearly with increasing spacing from the zero point 117 in the x direction, as shown by the curve 112 of the strength of the gradient field in the x direction. The first axis 100 of graph 123 of FIG. 4 corresponds to the first axis 100 of the graph 122 of FIG. 3.

The strength of the gradient field grows by 5 mT/m. The first spacing 109 is 20 cm, the second spacing 110 is 50 cm and the third spacing 111 is 80 cm. The first coil element 103 therefore experiences a frequency shift between the first and second signal frequencies of 42.58 kHz which is the product of the strength of the gradient field at the location of the first center 106 and of the gyromagnetic constant 42.58 Mhz/T. The second coil element 104 experiences a frequency shift of 106.45 kHz and the third coil element 105 a frequency shift of 170.32 kHz. The first signal frequency is determined according to the further method step 41 while the second signal frequency is determined according to the further method step 43. A conclusion can be drawn from the measured frequency shifts between the first and second signal frequencies about the spacings 109,110,111 of the centers 106,107,108 of the coil elements 103,104,105 in the x direction from the zero point 117. For this the measured frequency shift is divided by the gyromagnetic constant and the increase in the gradient field in the x direction (5 mT/m). The numerical values used should of course be regarded as merely example and may be replaced by any desired numerical values.

Figure 5:
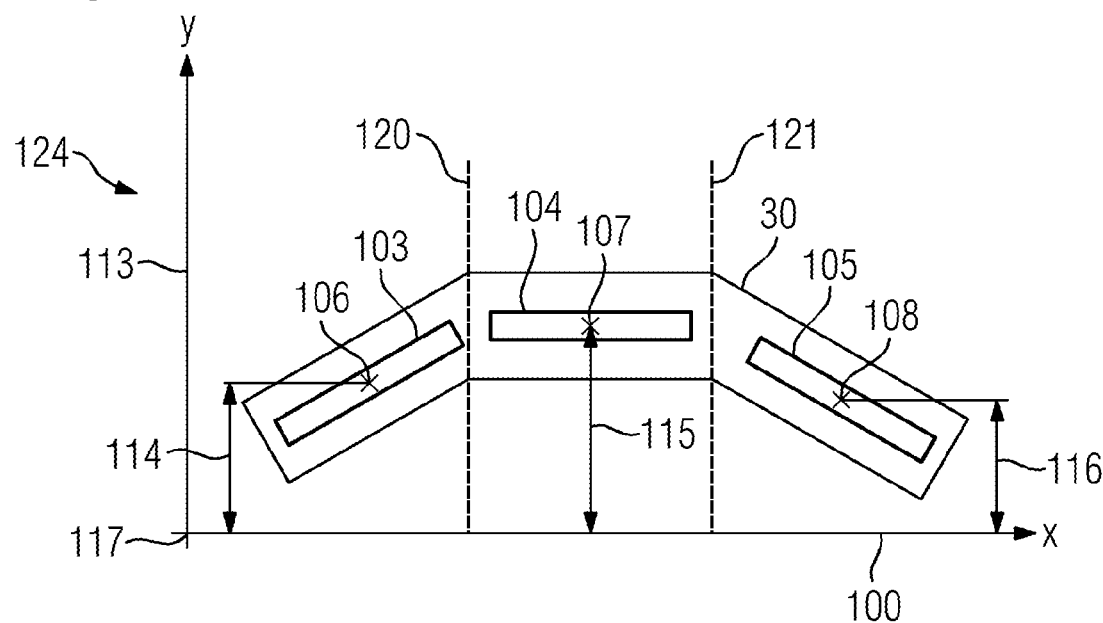
FIG. 5 shows an example embodiment of an inventive determination of the positions of three coil elements of a high frequency coil in the y direction.
Figure 6:
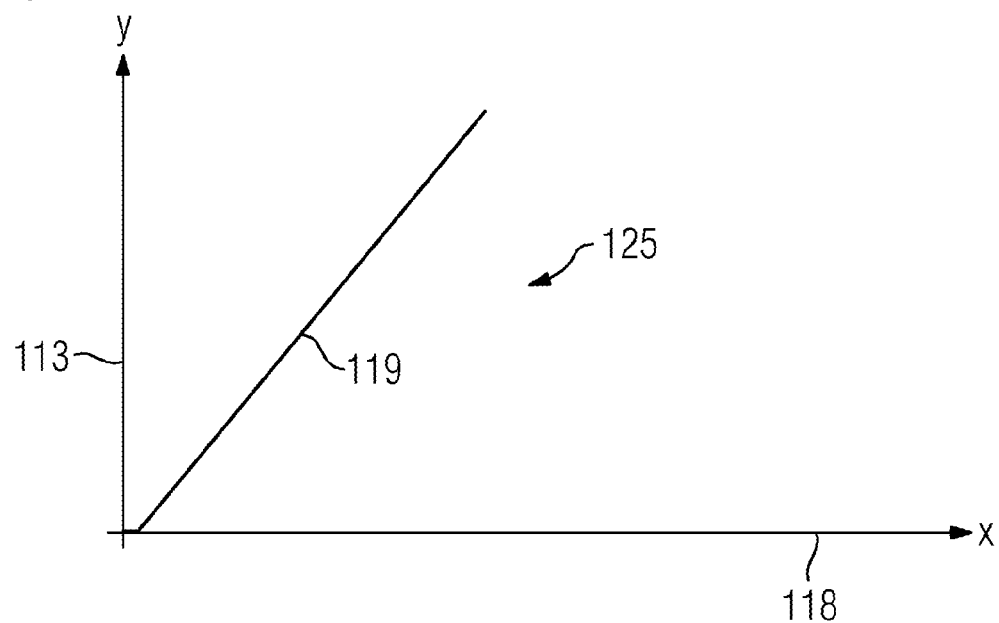
FIG. 6 shows the strength of the gradient field pertaining to FIG. 5 in the y direction.

FIG. 5 together with FIG. 6 shows an example determination of the positions of the three coil elements 32 of a high frequency coil 30 in the y direction according to the further method step 45. The x direction is plotted on the first axis 100 of graph 124 of FIG. 5 while the y direction is plotted on the second axis 113. The intersection 117 of the first axis 100 with the second axis 113 is the zero point (origin, offset) of the gradient coil unit 19 of the magnetic resonance device 11 in the xy plane. A cross-section through a high frequency coil 30, which includes said three coil elements 103, 104, 105 with said three centers 106,107,108, is shown. The first center 106 has a first spacing 114 in the y direction from the zero point 117. Similarly, the second center 107 has a second spacing 115 from the zero point 117 in the y direction and the third center 108 a third spacing 116 from the zero point 117 in the y direction. The y direction is in turn plotted on the second axis 113 of graph 125 of FIG. 6 while the strength of the gradient field in the y direction is plotted on the first axis 118, wherein the gradient field is applied according to the further method step 42 during recording of the second signal frequencies. The strength of the gradient field grows linearly with increasing spacing from the zero point 117 in the y direction, as shown by the curve 119 of the strength of the gradient field in the y direction. The second axis 113 of graph 125 of FIG. 6 corresponds to the second axis 113 of graph 124 of FIG. 5.

The strength of the gradient field grows by 5 mT/m. The first spacing 114 in the y direction is 20 cm, the second spacing 115 is 40 cm and the third spacing 116 is again 20 cm. The first coil element 103 therefore experiences a frequency shift between the first and second signal frequency of 42.58 kHz, the second coil element 104 experiences a frequency shift of 85.16 kHz and the third coil element 105 a frequency shift of 42.58 kHz again. The first signal frequency is determined according to the further method step 41, while the second signal frequency is determined according to the further method step 43. A conclusion can be drawn from the measured frequency shifts between the first and second signal frequencies about the spacings 114,115,116 of the centers 106,107,108 of the coil elements 103,104,105 in the y direction from the zero point 117. For this the measured frequency shift is divided by the gyromagnetic constant and the increase in the gradient field in the y direction (5 mT/m). The numerical values used should of course be regarded as merely example and may be replaced by any desired numerical values.

Similarly, the positions of the coil elements 103,104,105 in the z direction may also be determined as shown in FIG. 3-6. Here the gradient field is then superimposed by the main magnetic field 18 in the z direction.

FIG. 5 also shows a first flexibility axis 120 of the high frequency coil 30 between the first coil element 103 and the second coil element 104 and a second flexibility axis 121 of the high frequency coil 30 between the second coil element 104 and the third coil element 105. The general attenuation map of the high frequency coil 30 can be rotated or tilted at these flexibility axes 120,121 to create the position-dependent attenuation map. In the illustrated case a position different from the second center 107 has been ascertained in the y direction for the first center 106. The first coil element 103 in the general attenuation map is therefore tilted as a whole, and in particular block-wise, at the first flexibility axis 120 during registration. Compared with a completely non-rigid transformation of the general attenuation map this has the advantage that the geometrically rigid elements of the coil elements, by way of example the pre-amplifier, are not distorted by the non-rigid transformation. Registration errors can therefore be avoided. The known spacing between the first center 106 and second center 107 in the x direction provides one boundary condition for tilting of the first coil element 103. The direct connecting line between the first center 106 and the second center 107 in the xy plane must therefore be shorter than the known spacing between the first center 106 and second center 107 in the x direction.

Although the invention has been illustrated and described in detail by the preferred example embodiments it is nevertheless not limited by the disclosed examples and a person skilled in the art can derive other variations herefrom without departing from the scope of the invention.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for determining a position-dependent attenuation map of at least one high frequency coil of a combined magnetic resonance positron emission tomography device (magnetic resonance PET device), wherein the high frequency coil includes at least one coil element, comprising:
   determining at least one first signal frequency for the at least one coil element during a magnetic resonance PET examination;
   determining at least one second signal frequency for the at least one coil element during the magnetic resonance PET examination, wherein at least one gradient field is applied during determination of the at least one second signal frequency;
   reconstructing a position of the at least one coil element using the at least one first signal frequency and the at least one second signal frequency;
   reconstructing a position of the at least one high frequency coil using the reconstructed position of the at least one coil element; and
   determining the position-dependent attenuation map of the at least one high frequency coil using the reconstructed position of the at least one high frequency coil.

2. The method of claim 1, wherein the at least one gradient field applied during determination of the at least one second signal frequency has a gradient field strength whose value differs from the gradient field strength of a gradient field applied during determination of the at least one first signal frequency.

3. The method of claim 1, wherein determination of the at least one second signal frequency includes determination of a signal frequency for a spatial direction, wherein determination of the signal frequency for the spatial direction includes applying a gradient field in the spatial direction.

4. The method of claim 1, wherein reconstruction of the position of the at least one coil element is carried out by way of at least one frequency difference between the at least one first signal frequency and the at least one second signal frequency.

5. The method of claim 1, wherein reconstruction of the position of the at least one high frequency coil includes using an item of information about at least one of construction and geometry of the at least one high frequency coil.

6. The method of claim 1, wherein the at least one high frequency coil comprises a plurality of coil elements which are arranged in the form of a grid, wherein reconstruction of the position of the at least one high frequency coil includes adapting a landmark grid to the reconstructed positions of the plurality of coil elements.

7. The method of claim 6, wherein adaptation of the landmark grid includes using properties of the at least one high frequency coil as boundary conditions.

8. The method of claim 1, wherein a combined attenuation map of the magnetic resonance PET device is ascertained by way of the position-dependent attenuation map of the at least one high frequency coil and a global attenuation map of the magnetic resonance PET device.

9. A magnetic resonance PET device comprising:
   an arithmetic logic unit, wherein the magnetic resonance PET device is designed to
      determine at least one first signal frequency for at least one coil element during a magnetic resonance PET examination;
      determine at least one second signal frequency for the at least one coil element during magnetic resonance PET examination, wherein at least one gradient field is applied during determination of the at least one second signal frequency;

reconstruct a position of the at least one coil element using the at least one first signal frequency and the at least one second signal frequency;

reconstruct a position of at least one high frequency coil using the reconstructed position of the at least one coil element; and determine a position-dependent attenuation map of the at least one high frequency coil using the reconstructed position of the at least one high frequency coil.

10. A computer program product, directly loadable into a memory of a programmable arithmetic logic unit of a magnetic resonance PET device, including program code segments to carry out the method of claim 1 when the computer program product is executed in the arithmetic logic unit of the magnetic resonance PET device.

11. The method of claim 2, wherein determination of the at least one second signal frequency includes determination of a signal frequency for a spatial direction, wherein determination of the signal frequency for the spatial direction includes applying a gradient field in the spatial direction.

12. The method of claim 2, wherein reconstruction of the position of the at least one coil element is carried out by way of at least one frequency difference between the at least one first signal frequency and the at least one second signal frequency.

13. The method of claim 2, wherein reconstruction of the position of the at least one high frequency coil includes using an item of information about at least one of construction and geometry of the at least one high frequency coil.

14. The method of claim 2, wherein the at least one high frequency coil comprises a plurality of coil elements which are arranged in the form of a grid, wherein reconstruction of the position of the at least one high frequency coil includes adapting a landmark grid to the reconstructed positions of the plurality of coil elements.

15. A computer program product, directly loadable into a memory of a programmable arithmetic logic unit of a magnetic resonance PET device, including program code segments to carry out the method of claim 2 when the computer program product is executed in the arithmetic logic unit of the magnetic resonance PET device.

* * * * *